US011555791B2

(12) United States Patent
Frankovich et al.

(10) Patent No.: US 11,555,791 B2
(45) Date of Patent: Jan. 17, 2023

(54) CHAMBER FOR VIBRATIONAL AND ENVIRONMENTAL ISOLATION OF THIN WAFERS

(71) Applicant: CORNING INCORPORATED, Corning, NY (US)

(72) Inventors: John Weston Frankovich, Fairport, NY (US); Christopher Alan Lee, Pittsford, NY (US); Matthew Ronald Millecchia, Fairport, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 16/953,544

(22) Filed: Nov. 20, 2020

(65) Prior Publication Data

US 2021/0164915 A1 Jun. 3, 2021

Related U.S. Application Data

(60) Provisional application No. 62/942,947, filed on Dec. 3, 2019.

(51) Int. Cl.
*G01N 21/95* (2006.01)
*G01N 21/01* (2006.01)
(Continued)

(52) U.S. Cl.
CPC ..... *G01N 21/9501* (2013.01); *G01B 9/02021* (2013.01); *G01B 9/02027* (2013.01);
(Continued)

(58) Field of Classification Search
CPC ............ G01B 2210/56; G01B 9/02021; G01B 9/02027; G01B 9/02052; G01N 21/01; G01N 21/9501; G01N 21/45
See application file for complete search history.

(56) References Cited

U.S. PATENT DOCUMENTS 5,964,989 A * 10/1999 Nakao ..................... H01J 37/34
204/192.12
6,178,813 B1 * 1/2001 Bruno ..................... G01Q 70/04
850/10
(Continued)

FOREIGN PATENT DOCUMENTS

JP 11-108644 A 4/1999
JP 2002-206985 A 7/2002
(Continued)

OTHER PUBLICATIONS

International Search Report and Written Opinion of the International Searching Authority; PCT/US2020/062634; dated Mar. 23, 2021, 17 pages; European Patent Office.
(Continued)

*Primary Examiner* — Violeta A Prieto
(74) *Attorney, Agent, or Firm* — Kevin L. Bray

(57) ABSTRACT

Measurement cavities described herein include a cylindrical chamber having a first open end and a second open end; a first cap covering the first open end of the cylindrical chamber and a second cap covering the second open end of the cylindrical chamber, wherein the first and second caps hermetically seal the cylindrical chamber and wherein the first cap is rigidly coupled to the second cap; and a wafer holder positioned within and coupled to the cylindrical chamber. The measurement cavity has a mass m, a stiffness k, and a damping constant c configured such that the transmissibility $$\left|\frac{x}{F}\right|$$

(Continued)

of an input force at 60 Hz in the measurement cavity is reduced by a factor of at least 10 and the measurement cavity has a natural frequency of greater than 300 Hz.

22 Claims, 10 Drawing Sheets

(51) Int. Cl.
    *G01N 21/45*     (2006.01)
    *G01B 9/02*     (2022.01)
    *G01B 9/02015*     (2022.01)
    *G01B 9/02017*     (2022.01)

(52) U.S. Cl.
    CPC ......... *G01B 9/02052* (2013.01); *G01N 21/01* (2013.01); *G01N 21/45* (2013.01)

(56) References Cited

U.S. PATENT DOCUMENTS

| | | | |
|---|---|---|---|
| 6,347,175 B1* | 2/2002 | Chen | C03C 17/09 |
| | | | 385/80 |
| 6,537,421 B2* | 3/2003 | Drewery | H01J 37/32706 |
| | | | 156/345.48 |
| 8,379,219 B2* | 2/2013 | Frankovich | G01B 9/02021 |
| | | | 356/485 |
| 9,939,728 B2 | 4/2018 | Peijster | |
| 10,943,767 B1* | 3/2021 | Kowal | H03L 7/0814 |
| 11,366,996 B2* | 6/2022 | Johnson | G06K 19/07758 |
| 2001/0037856 A1* | 11/2001 | Park | H01L 21/67775 |
| | | | 156/345.31 |
| 2003/0019581 A1* | 1/2003 | Drewery | H01J 37/32082 |
| | | | 156/345.43 |
| 2005/0179733 A1* | 8/2005 | Silverbrook | B41J 2/1639 |
| | | | 347/54 |
| 2006/0005413 A1 | 1/2006 | Sinha et al. | |
| 2007/0279080 A1* | 12/2007 | Ohtsuki | G01R 31/2889 |
| | | | 324/754.04 |
| 2012/0300213 A1 | 11/2012 | Frankovich et al. | |
| 2013/0188162 A1* | 7/2013 | Gerhard | G03F 7/70266 |
| | | | 355/77 |
| 2014/0242306 A1* | 8/2014 | Koval | C03C 17/02 |
| | | | 428/34 |
| 2015/0007661 A1 | 1/2015 | Horan et al. | |
| 2019/0108987 A1* | 4/2019 | Tetsuka | H01J 37/32697 |
| 2021/0150300 A1* | 5/2021 | Johnson | G02B 3/14 |
| 2021/0301870 A1* | 9/2021 | Fesperman, Jr. | F16C 32/0614 |
| 2022/0261613 A1* | 8/2022 | Johnson | G06K 19/0672 |

FOREIGN PATENT DOCUMENTS

| | | |
|---|---|---|
| JP | 2002-280442 A | 9/2002 |
| JP | 4128811 B2 | 7/2008 |
| JP | 4758410 B2 | 8/2011 |
| KR | 10-2007-0082056 A | 8/2007 |
| KR | 10-1718378 B1 | 3/2017 |
| TW | 371290 B | 10/1999 |
| WO | 2014/050319 A1 | 4/2014 |

OTHER PUBLICATIONS

Microstat (TM) liquid cryogen optical cryostats for microscopy, Oxford Instruments NanoScience, PDF Catalogs, Brochure, Apr. 12, 2019, 8 pages.

MicrostatHe/MicrostatHe-R-Brochure, Available online at (http://www.labis.pl/resources/image/2015/karty/oxford/Microstat_He.pdf), Apr. 12, 2019, 4 pages.

Sputtering-Wikipedia, Available online at (https://en.wikipedia.org/w/index.php?title=Sputtering&oldid=919352798), Oct. 3, 2019, 6 pages.

* cited by examiner

CHAMBER FOR VIBRATIONAL AND ENVIRONMENTAL ISOLATION OF THIN WAFERS

This Application claims priority under 35 USC § 119(e) from U.S. Provisional Patent Application Ser. No. 62/942,947, filed on Dec. 3, 2019, and which is incorporated by reference herein in its entirety.

FIELD

The present specification generally relates to optical metrology and, more particularly, to an apparatus for vibrational and environmental isolation of thin wafers in a Fizeau interferometer.

BACKGROUND

In interferometry, highly precise surface measurement is obtained for various types of optical components using interference fringes that are generated between light reflected from a reference surface and light from a surface under test. The Fizeau interferometer is an instrument of this type that can be used to measure various optical surfaces, particularly spherical or planar surfaces having relatively large diameters.

Specifically, thin, large-diameter wafers are sensitive to external influences, such as floor vibrations, airflow, acoustics, temperature, and humidity. However, in some industries, measurements of wafers require sub-nanometer resolution.

Accordingly, a need exists for an interferometer that isolates the thin wafer from vibrational and environmental forces.

SUMMARY

According to a first aspect disclosed herein, a measurement cavity comprises a cylindrical chamber having a first open end and a second open end; a first cap covering the first open end of the cylindrical chamber and a second cap covering the second open end of the cylindrical chamber, wherein the first and second caps hermetically seal the cylindrical chamber and wherein the first cap is rigidly coupled to the second cap; and a wafer holder positioned within and coupled to the cylindrical chamber, the wafer holder having a first transmissibility $$\left|\frac{x}{F}\right|$$

of an input force F at 60 Hz; wherein the cylindrical cavity has a mass m, a stiffness k, and a damping constant c configured such that a second transmissibility $$\left|\frac{x}{F}\right|$$

of the input force at 60 Hz in the measurement cavity is a factor of at least 10 less than the first transmissibility $$\left|\frac{x}{F}\right|,$$

and wherein the measurement cavity has a natural frequency of greater than 300 Hz.

According to a second aspect disclosed herein, a measurement cavity includes the measurement cavity according to the first aspect, wherein the first cap, the second cap, or the first cap and the second cap comprise reference optics through which one or more interferometric or optical measurements can be taken.

According to a third aspect disclosed herein, a measurement cavity includes the measurement cavity according to the first or second aspects, wherein the first cap and the second cap comprise reference optics through which one or more interferometric or optical measurements can be taken.

According to a fourth aspect disclosed herein, a measurement cavity includes the measurement cavity according to the first through third aspects, wherein the reference optics comprise a glass substrate mounted within a bezel.

According to a fifth aspect disclosed herein, a measurement cavity includes the measurement cavity according to the fourth aspect, wherein the bezel is formed from metal.

According to a sixth aspect disclosed herein, a measurement cavity includes the measurement cavity according to the fourth or fifth aspects, wherein the bezel is rigidly coupled to the cylindrical chamber.

According to a seventh aspect disclosed herein, a measurement cavity includes the measurement cavity according to the sixth aspect, wherein the bezel is bolted to the cylindrical chamber.

According to an eighth aspect disclosed herein, a measurement cavity includes the measurement cavity according to any of the fourth through seventh aspects, wherein epoxy seals the glass substrate within the bezel.

According to a ninth aspect disclosed herein, a measurement cavity includes the measurement cavity according to any previous aspect, wherein the wafer holder is rigidly coupled to the cylindrical chamber.

According to a tenth aspect disclosed herein, a measurement cavity includes the measurement cavity according to any of the first through eighth aspects, wherein the wafer holder is coupled to the cylindrical chamber via one or more springs.

According to an eleventh aspect disclosed herein, a measurement cavity includes the measurement cavity according to any previous aspect, wherein the wafer holder is configured to hold a wafer without contacting first and second side surfaces of the wafer.

According to a twelfth aspect disclosed herein, a measurement cavity includes the measurement cavity according to any previous aspect, wherein the first cap is rigidly coupled to the second cap via a clamp.

According to a thirteenth aspect disclosed herein, a measurement cavity includes the measurement cavity according to any of the first through eleventh aspects, wherein the first cap is rigidly coupled to the second cap via one or more bolts.

According to a fourteenth aspect disclosed herein, a measurement cavity includes the measurement cavity according to any previous aspect, wherein the cylindrical chamber sets a gap between a first face of the first cap and a first face of the second cap.

According to a fifteenth aspect disclosed herein, a measurement cavity includes the measurement cavity according to any previous aspect, wherein the cylindrical chamber is formed from a metal or metal-based substrate.

According to a sixteenth aspect disclosed herein, a measurement cavity includes the measurement cavity according to any previous aspect, wherein the cylindrical chamber is formed from an aluminum-based substrate or stainless steel.

According to a seventeenth aspect disclosed herein, a measurement cavity includes the measurement cavity according to any previous aspect, wherein the first cap and the second cap are mounted in a non-deforming configuration with respect to one another.

According to an eighteenth aspect disclosed herein, an interferometer comprises the measurement cavity according to any preceding aspect.

According to a nineteenth aspect, an interferometer includes the interferometer according to the eighteenth aspect, wherein the interferometer makes measurements from one of the first and second caps.

According to a twentieth aspect, an interferometer includes the interferometer according to the eighteenth aspect, wherein the interferometer is a compound interferometer and makes measurements from the first and second caps.

Additional features and advantages will be set forth in the detailed description, which follows, and in part will be readily apparent to those skilled in the art from that description or recognized by practicing the embodiments described herein, including the detailed description, which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Figure 1A:
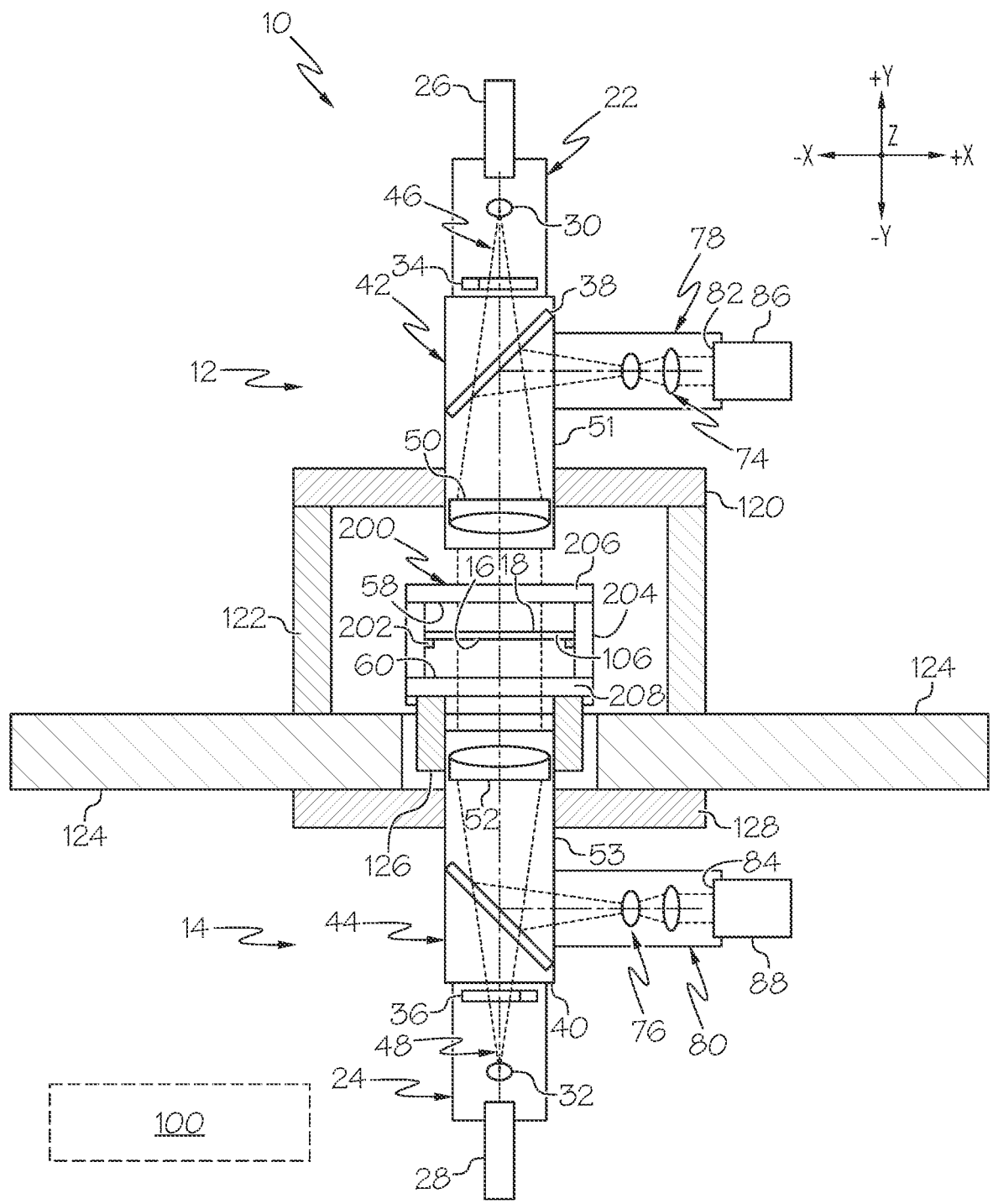
FIG. 1A is a diagram of a compound interferometer including a measurement cavity according to one or more embodiments shown and described herein.

Reference will now be made in detail to various embodiments, examples of which are illustrated in the accompanying drawings. Whenever possible, the same reference numerals will be used throughout the drawings to refer to the same or like parts.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example up, down, right, left, front, back, top, bottom—are made only with reference to the figures as drawn and are not intended to imply ab solute orientation.

Unless otherwise expressly stated, it is in no way intended that any method set forth herein be construed as requiring that its steps be performed in a specific order, nor that with any apparatus specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an" and "the" include plural referents unless the context clearly dictates otherwise. Thus, for example, reference to "a" component includes aspects having two or more such components, unless the context clearly indicates otherwise.

The term "formed from" can mean one or more of comprises, consists essentially of, or consists of. For example, a component that is formed from a particular material can comprise the particular material, consist essentially of the particular material, or consist of the particular material.

FIG. 1A depicts an interferometer 10 according to various embodiments. The interferometer 10 in FIG. 1A is a compound interferometer which includes an upper interferometer 12 and a lower interferometer 14 for measuring opposite first and second side surfaces 16 and 18 of a wafer 106. Although FIG. 1A depicts the interferometer 10 as a compound interferometer that is configured to measure the wafer 106 from the first and second side surfaces 16 and 18, other types of interferometers, including a single interferometer which measures the wafer 106 from one side, are contemplated. In addition, although described herein as being used to measure a wafer 106, it is contemplated that the interferometer 10 can be used to measure any opaque test part that is made of materials that are not transmissive within the range of frequencies propagated by the interferometers 12 and 14, or that is sufficiently diffuse to preclude the ordered transmissions of such frequencies.

The upper and lower interferometers 12 and 14 include respective first and second illuminators 22 and 24, which can include customary light sources 26 and 28 and beam shapers 30 and 32 for outputting coherent first and second measuring beams 46 and 48. For example, the light sources 26 and 28 can be semiconductor diode lasers, and the beam shapers 30 and 32 can include beam expanders and conditioners for affecting distributions of light within the measuring beams 46 and 48.

Within their respective upper and lower interferometers 12 and 14, the first and second measuring beams 46 and 48 propagate through first and second shutters 34 and 36 to first and second beam splitters 38 and 40, where the first and second measuring beams 46 and 48 are directed (e.g., transmitted) into first and second measurement arms 42 and 44. Opening and closing of the first and second shutters 34 and 36 can be coordinated by a common processor/controller 100 for alternately blocking the propagation of one or the other of the first and second measuring beams 46 and 48 to prevent light from one interferometer 12 or 14 from mixing with the light from the other interferometer 14 or 12. The first and second beam splitters 38 and 40 can take the form of pellicle beam splitters, beam splitter cubes, or beam splitter plates based on splitting amplitude or polarization.

The measurement arms 42 and 44 include dual functioning optics 50 and 52 within housings 51 and 53, which contribute to both illuminating and imaging the wafer 106. The illuminating function of the dual optics 50 and 52 generally provides for sizing and shaping respective wavefronts of the measuring beams 46 and 48 to nominally match the shapes of the opposite side surfaces 16 and 18 of the wafer 106.

Figure 1B:
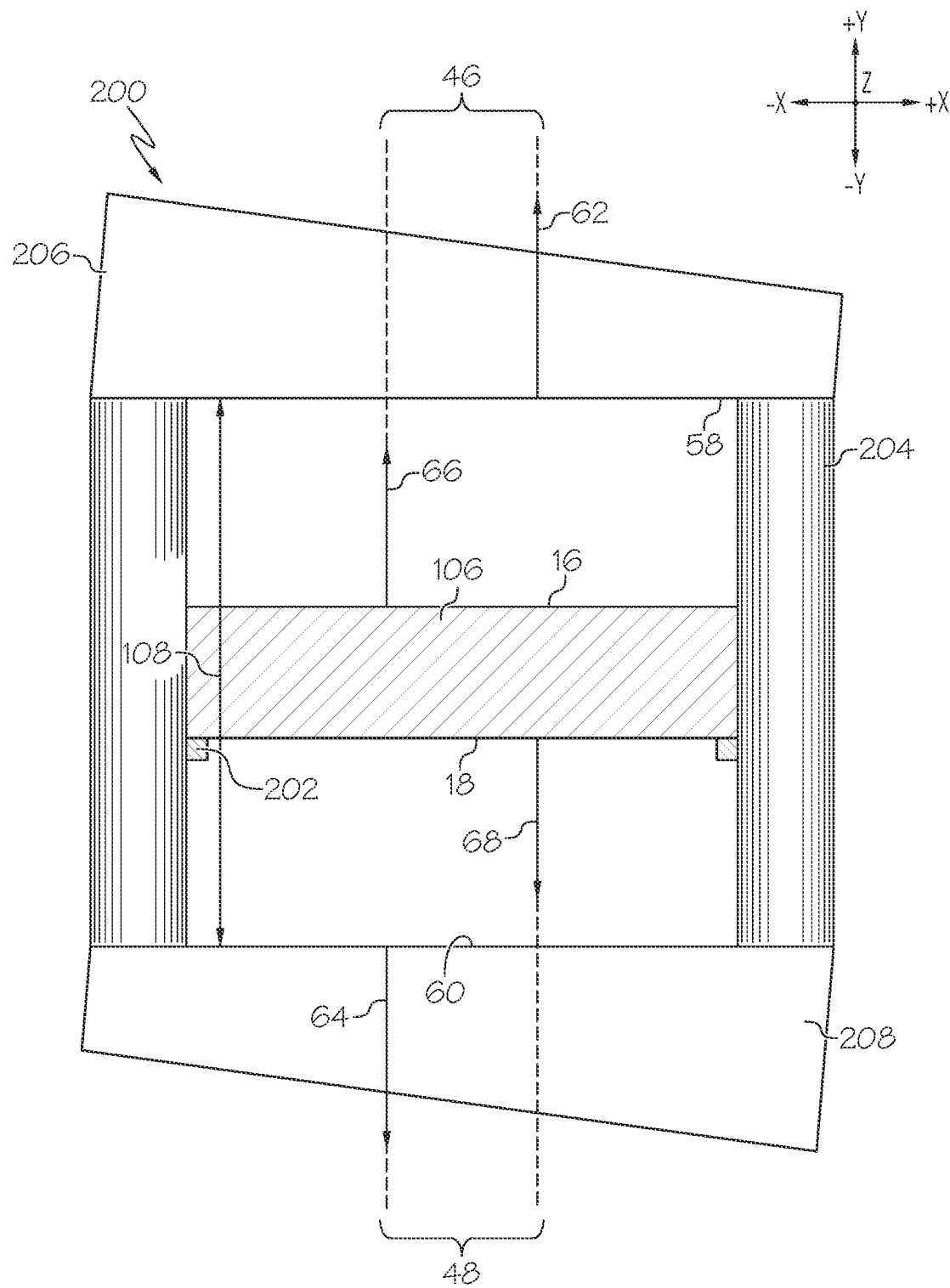
FIG. 1B is a diagram of the measurement cavity depicting multiple reflections for producing interference patterns within the measurement cavity according to one or more embodiments shown and described herein.

As shown in FIG. 1B, the first and second measurement arms 42 and 44 also include first and second caps 206 and 208 which include reference optics (e.g., Fizeau wedges) having first and second reference surface 58 and 60 for reflecting portions of the first and second measuring beams 46 and 48 as reference beams 62 and 64. The reference optics are selected to be transmissive within the range of frequencies propagated by the interferometers 12 and 14. Although described in various embodiments herein as being included in the first and second caps 206 and 208, it is contemplated that the reference optics can be independent of the caps in some embodiments. Remaining portions of the measuring beams 46 and 48 propagate through the first and second caps 206, 208, and certain transverse sections of the remaining portions of the measuring beams 46 and 48 reflect from the opposite side surfaces 16 and 18 of the wafer 106 as test object beams 66 and 68.

The test object beam 66 combines with the reference beam 62 at the reference surface 58 to form an interference pattern (not shown) registering differences between the first side surface 16 and the reference surface 58. Moreover, the test object beam 68 combines with the reference beam 64 at the reference surface 60 to form an interference pattern (not shown) registering differences between the second side surface 18 and the reference surface 60.

The reflected test object beam 66 and the reference beam 62 both propagate along a common optical pathway through the measurement arm 42 to the beam splitter 38, where at least portions of the beams 66 and 62 are directed (e.g., reflected) into a recording arm 78 of the upper interferometer 12. Similarly, the reflected test object beam 68 and the reference beam 64 both propagate along a common optical pathway through the measurement arm 44 to the beam splitter 40, where at least portions of the beams 68 and 64 are directed (e.g., reflected) into a recording arm 80 of the lower interferometer 14.

Returning to FIG. 1A, within the recording arm 78, the interference patterns formed at the first reference surface 58 are imaged onto detector surface 82 of camera 86. Similarly, within the recording arm 80, the interference patterns formed at the second reference surface 60 are imaged onto detector surface 84 of camera 88. The detector surfaces 82 and 84 can include detector arrays for measuring beam intensity throughout a field of view encompassing the opposite side surfaces 16 and 18 of the wafer 106. The dual optics 50 and 52 can contribute to the formation of the referenced images onto the detector surface 82 and 84. However, the cameras 86 and 88 can include or be associated with imaging optics 74 and 76 for resizing or otherwise completing the imaging of the referenced images onto the detector surfaces 82 and 84.

Figure 2:
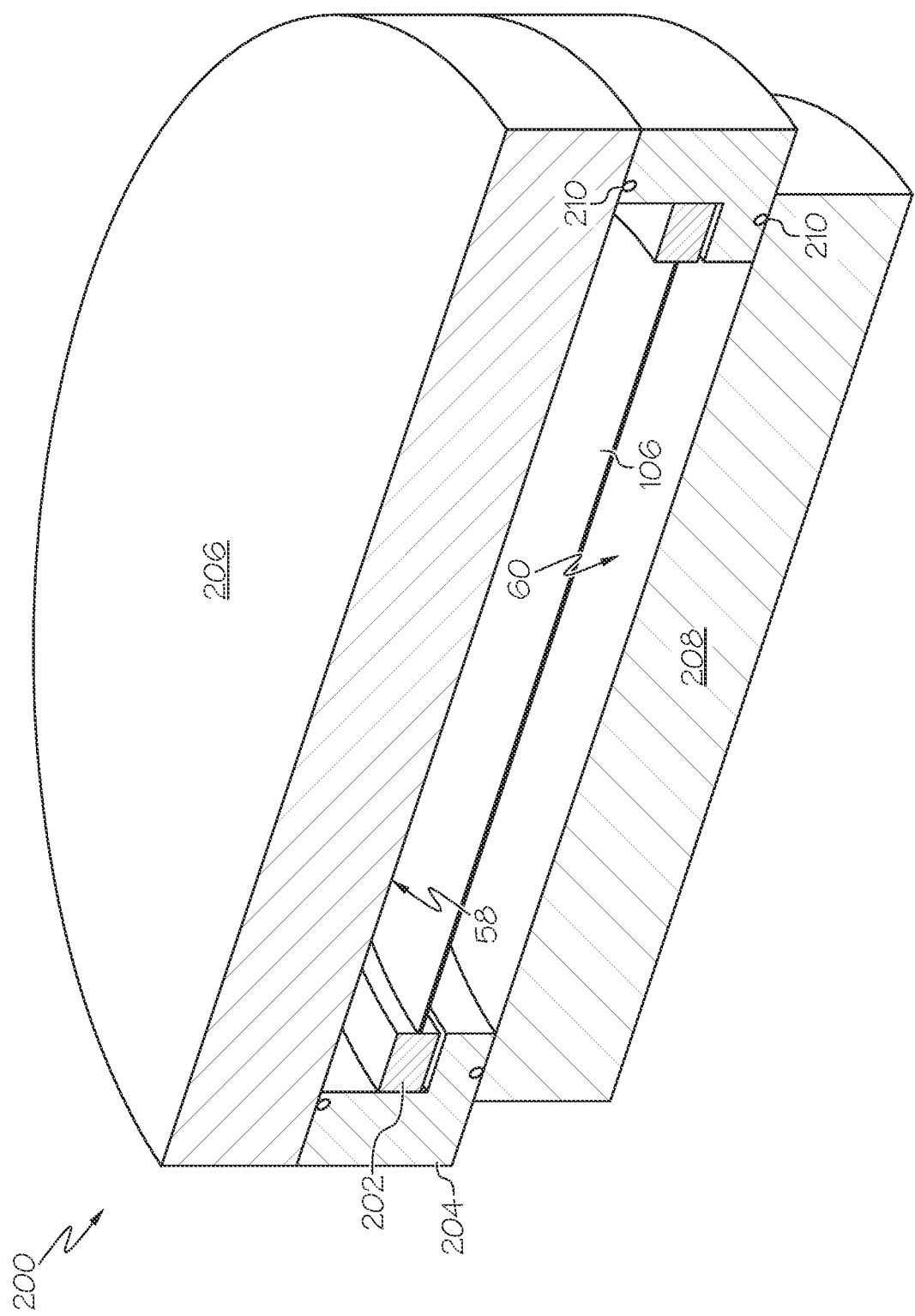
FIG. 2 is a cross-sectional view of a measurement cavity including a wafer according to one or more embodiments shown and described herein.

In FIGS. 1A and 1B, the first and second caps 206 and 208 are physically interconnected by a cylindrical chamber 204 to form a measurement cavity 200. The measurement cavity 200 protects and preserves the overall integrity of the optical reference cavity 108 formed by the two reference surfaces 58 and 60. In various embodiments, the measurement cavity additionally isolates the wafer 106 from environmental and vibrational forces. An example measurement cavity 200 is shown in FIG. 2. In particular, FIG. 2 shows a cross-sectional view of a measurement cavity 200 including a wafer 106.

As shown in FIG. 2, the wafer 106 is secured within the measurement cavity 200 by a wafer holder 202 that is positioned within and coupled to a cylindrical chamber 204. The cylindrical chamber 204 has a first open end and a second open end opposing the first open end. A first cap 206 covers the first open end of the cylindrical chamber 204, and a second cap 208 covers the second open end of the cylindrical chamber 204. In various embodiments, the first and second caps 206, 208 hermetically seal the cylindrical chamber 204.

In various embodiments, the cylindrical chamber 204 is formed from a metal or metal-based substrate. For example, the cylindrical chamber 204 can be formed from an aluminum-based substrate or stainless steel. Other materials are contemplated, provided that they enable isolation of the interior of the measurement cavity from the exterior of the measurement cavity. Although in the embodiment depicted in FIG. 2, the cylindrical chamber 204 includes a lip supporting the wafer holder 202, in embodiments, the interior of the cylindrical chamber 204 can be defined by a straight, flat wall from the first open end to the second open end. Other configurations are also possible and contemplated, and can be selected based on the specific application of the cylindrical chamber 204.

The first cap 206 is rigidly coupled to the second cap 208 in various embodiments. The rigid coupling of the first cap 206 to the second cap 208 maintains alignment between the first and second caps, enabling the caps to be used as Fizeau optics and reference surfaces while reducing errors and enabling increased resolution, as will be described in greater detail below. In embodiments, the cylindrical chamber 204 sets a gap between reference surface 58 of the first cap 206 and reference surface 60 of the second cap 208. For example, each of the first cap 206 and the second cap 208 can be in contact with the corresponding end of the cylindrical chamber 204 to maintain a constant distance between the reference surfaces 58 and 60, as shown in FIG. 2.

In embodiments, a mechanical structure other than the cylindrical chamber 204 is used to set the gap between the reference surfaces 58 and 60. For example, two or more spacing pins (not shown) can be used to define a gap between the reference surfaces 58 and 60. The spacing pins or other mechanical structure can be formed from a thermally stable material, such as Invar. The spacing pins can extend through recesses in the cylindrical chamber 204 to contact the first and second caps 206, 208. Kinematically, the rigid coupling of the first cap 206 and the second cap 208 assures that the reference surfaces 58 and 60 are subject to the same motion, as if parts of a single body. Thus, any motion affecting one of the two reference surfaces 58 or 60 similarly affects the other of the two reference surfaces 60 or 58. In various embodiments, the gap between the reference surfaces 58 and 60 is substantially uniform (e.g., the gap varies by less than 10 µm over the area of the reference surfaces).

Regardless of how the first cap 206 and the second cap 208 are rigidly coupled to one another, in various embodiments, the first and second caps 206 and 208 are in a low stress or stress-free configuration with respect to one another so as not to deform the Fizeau optics. In various embodiments, the configuration of the first and second caps 206 and 208 with respect to one another result in the first cap 206 and the second cap 208 are deformed less than 10 µm. In embodiments, the first and second caps 206 and 208 are mounted in a non-deforming configuration with respect to one another.

As set forth above, in various embodiments, the first cap 206, the second cap 208, or both the first cap 206 and the second cap 208 includes reference optics through which one or more interferometric or optical measurements can be taken. When the reference optics are Fizeau optics, the first cap 206 and the second cap 208 may be in the form of a wedge, in which one of the surfaces is angled at about 1 degree relative to an opposing surface. The angle is set such that the reflection off the sloped surface does not return to the camera and interfere with the test or reference beams. It should be appreciated that other designs for the reference optics can be employed, and optical measurements can be taken from one or both sides of the wafer 106.

Figure 3:
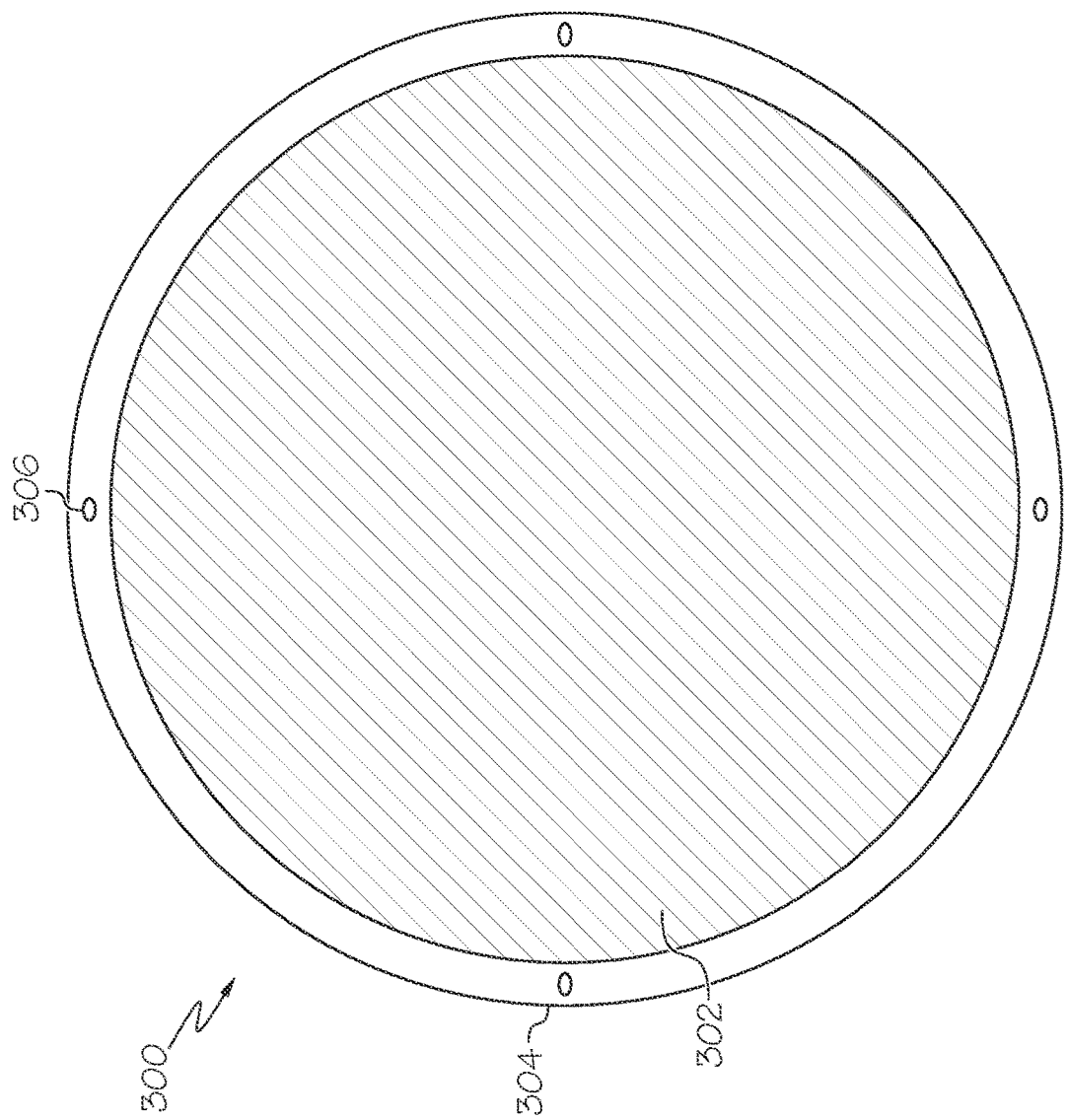
FIG. 3 is a top view of an optical reference that can form a cap of a measurement cavity according to one or more embodiments shown and described herein.

In various embodiments, at least part of the cap may be formed from glass or another optically-transparent material. In some embodiments, such as the embodiment shown in FIG. 2, the entire first cap 206 and/or second cap 208 can be a glass substrate, and the whole cap can be an optical reference. In some embodiments, the optical reference 300 can include a Fizeau wedge 302 mounted within a bezel 304 or other annular housing, as shown in FIG. 3. An epoxy or other adhesive can be used to secure and seal the Fizeau wedge 302 within the bezel 304.

The bezel 304 can be formed from metal, such as aluminum or stainless steel, or another material that is sufficiently to rigidly hold the Fizeau wedge 302 in place and form a hermetic seal with the cylindrical chamber 204. In various embodiments, the bezel 304 is rigidly coupled to the cylindrical chamber 204, and can be secured in position using an adhesive or bolts. For example, bolts 402 (shown in FIG. 4) may pass through holes 306 in the bezel 304 to secure the optical reference 300 to the cylindrical chamber 204 (not shown in FIG. 3).

In various embodiments, such as embodiments in which the first cap 206 and the second cap 208 are formed completely from a glass substrate without a bezel 304 to enable the cap to be bolted to the cylindrical chamber 204, an epoxy or other adhesive can be used to couple the first cap 206 and/or the second cap 208 to the cylindrical chamber 204. However, in various embodiments, in order to enable one or both of the caps to be removed from the cylindrical chamber 204, such as to insert or remove the wafer 106, in embodiments, the first cap 206 and/or the second cap 208 can be removably sealed to the cylindrical chamber 204. For example, the first cap 206 and the second cap 208 can be positioned over the first open end and the second open end, respectively, of the cylindrical chamber 204, and can be clamped or otherwise secured in place.

Returning to FIG. 2, in embodiments, a gasket 210, such as an o-ring or other elastomer seal or a metal seal including brazing, is positioned between each cap and the cylindrical chamber 204 to ensure that the measurement cavity 200 is airtight. Without being bound by theory, establishing an airtight chamber can reduce or eliminate the effect of airflow on the wafer 106 as well as provide acoustic isolation of the wafer 106. It is also noted that by making the measurement cavity 200 airtight, the effects of variations in temperature and humidity on the wafer 106 can be reduced.

Figure 4:
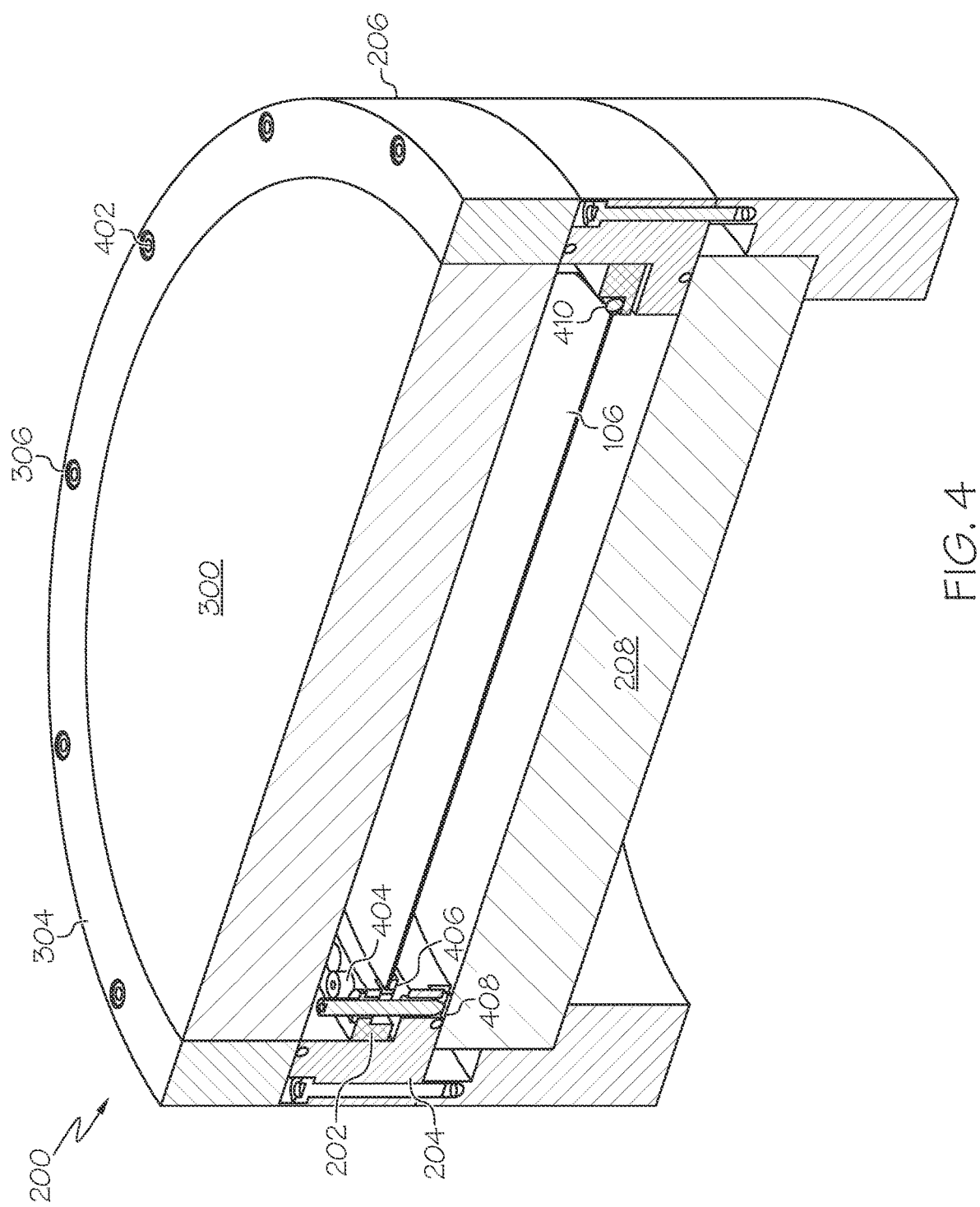
FIG. 4 is a cross-sectional view of a measurement cavity including a wafer held by a spring-mounted wafer holder according to one or more embodiments shown and described herein.
Figure 5:
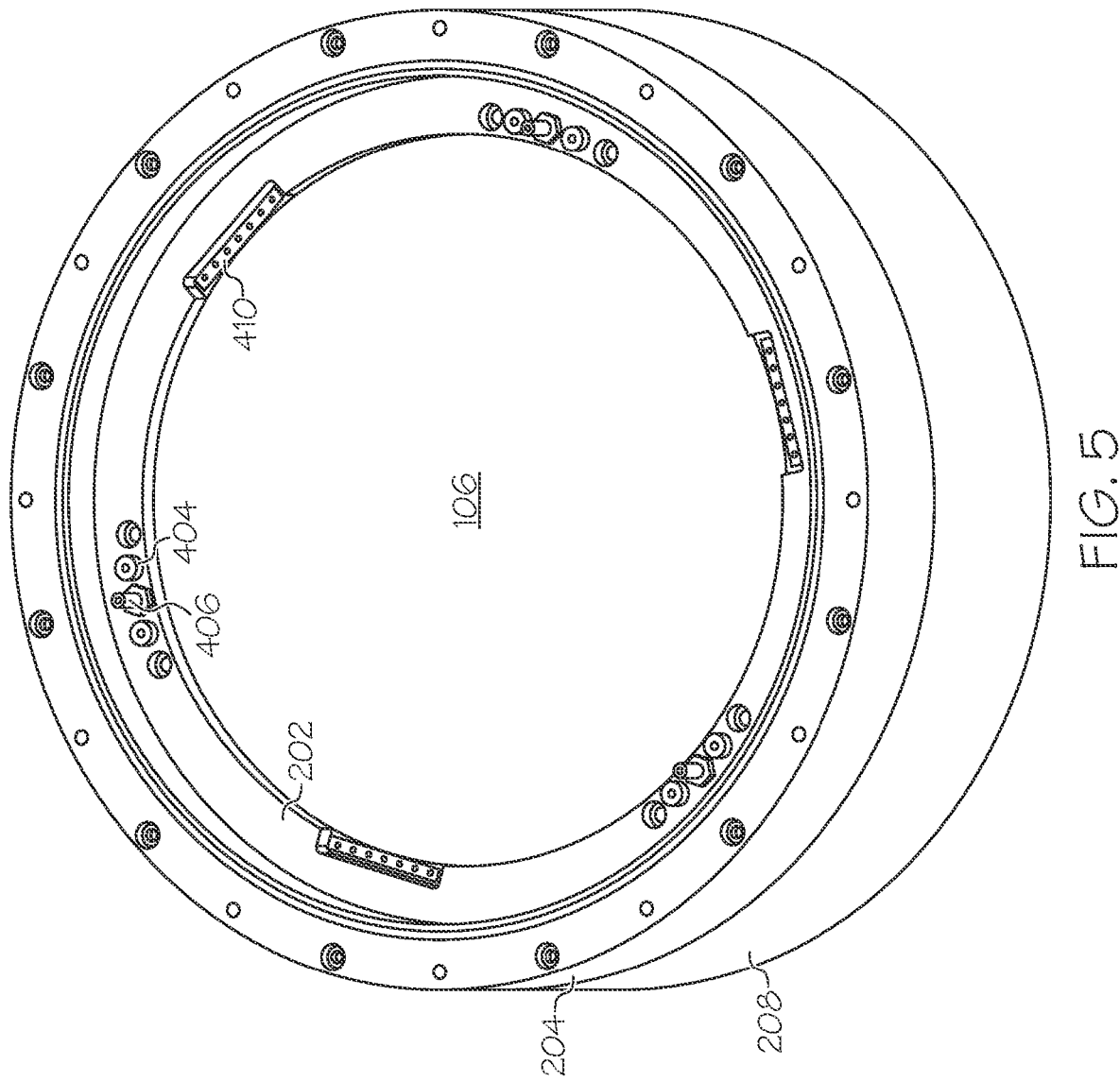
FIG. 5 is a top view of a measurement cavity having the first cap removed to depict a wafer holder according to one or more embodiments shown and described herein.

As shown in FIGS. 2, 4, and 5, the wafer 106 is positioned by a wafer holder 202. The wafer holder 202 can be rigidly coupled or coupled with intermediate damping to the cylindrical chamber 204. For example, the wafer holder 202 can be bolted or adhered to the cylindrical chamber 204, or the wafer holder 202 can be coupled to the cylindrical chamber 204 via one or more springs 404, as shown in FIGS. 4 and 5.

In the embodiment depicted in FIGS. 4 and 5, the wafer holder 202 is coupled to the cylindrical chamber 204 via one or more actuators 406 and springs 404. The actuators 406 and springs 404 enable the wafer holder 202 to be raised, lowered, or tilted with respect to the cylindrical chamber 204, depending on the particular embodiment. The springs 404 provide a return force to keep the actuators in contact with a vee 408 that is mounted to the second cap 208. In various embodiments, the stiffness of the springs can be varied to alter the damping and transmissibility of force from the cylindrical chamber 204 to the wafer holder 202, and thus, the wafer 106.

The wafer holder 202 further includes one or more wafer mounts 410 that are configured to receive the wafer 106. In the embodiment shown in FIG. 5, the wafer mounts 410 form a three-point mount that secures the wafer 106 within the measurement cavity 200. However, it is contemplated that the wafer holder 202 and/or the wafer mounts 410 can be otherwise configured. For example, in some embodiments, the wafer holder 202 can be configured such that they do not contact the first and second side surfaces 16 and 18 of the wafer 106, or such that they merely prevent the wafer 106 from moving outside of a boundary, such as in embodiments in which an air bearing is used to position the wafer 106. In embodiments, the wafer holder 202 provides for obscuring as little of the wafer 106 as possible. Regardless of the particular wafer mounts 410 and wafer holder 202 employed, in various embodiments, the wafer 106 is disposed in a "free state" or "quasi-free state" within the measurement cavity 200. In other words, the first and second side surfaces 16 and 18 of the wafer 106 are not mounted to, in contact with, or pressed against another structure, such as the wafer holder 202.

Returning again to FIG. 1A, during measurements in which the wafer 106 is illuminated by portions of the measuring beams 46 and 48, the wafer 106 is mounted as if a part of the measurement cavity 200 for maintaining a constant spacing and orientation between the opposite side surfaces 16 and 18 of the wafer 106 and the reference surfaces 58 and 60 of the caps 206 and 208. Thus, the interference patterns formed within the upper interferometer 12 and the lower interferometer 14 are minimally affected by disturbances that affect the measurement cavity 200 as a whole. Moreover, at least one of the caps (e.g., the first cap 206) is disconnected from the remainder of its measurement arm (e.g., measurement arm 42 in FIG. 1). For example, the housing 51 of the measurement arm 42 has no direct physical connection to the first cap 206 independently of the mounting as part of the measurement cavity 200. Instead, the housing 51 of the measurement arm 42 is mounted via a flange 120 and collar 122 to a base 124, which preferably has a substantial mass (e.g., as a granite slap or steel plate) to isolate the upper interferometer 12 from environmental disturbances. The measurement cavity 200, however, is connected through a collar 126 to the housing 53 of the measurement arm 44, and the housing 53 of the measurement arm 44 is connected through a flange 128 to the base 124. By separating one of the caps 206 (and, accordingly, one of the optical references) from the remainder of its measurement arm 42, the two caps 206, 208 are not subject to different movements, transfers, or other disturbances otherwise associated with their different measurement arms 42 and 44. The isolation of the measurement cavity 200 from one of the measurement arms 42 reduces structural demands on the measurement cavity 200 for maintaining the two reference surfaces 58 and 60 at a constant spacing and relative orientation. It is contemplated that the measurement cavity 200 can be disconnected from both of the measurement arms 42, 44 in embodiments.

Without being bound by theory, it is believed that a non-contact vibration can be induced in the optical elements (including the first and second caps 206, 208), the wafer 106, or both by resonate frequencies in the environment. Accordingly, in various embodiments, the measurement cavity 200 is designed to reduce or minimize the vibration transmission. In particular, to enable sub-nanometer measurements of wafer 106, in various embodiments, the measurement cavity 200 is specifically designed to reduce or block a zone of transmissible frequencies based on the natural frequencies of the wafer 106.

Vibrations from the external environment are transmitted as a time-dependent (e.g. oscillating) force to and through the interferometer 10 to the measurement cavity 200. Such forces are detrimental to the resolution of measurements made at the first and second surfaces 16 and 18 of the wafer 106 because they can cause motion of the wafer 106 relative to the first cap 206 and/or second cap 208. The motion can also affect alignment, the spacing between the first surface 16 and reference surface 58, and the spacing between the second surface 18 and reference surface 60. It is accordingly desirable to minimize transmission of vibrational force through and within the measurement cavity 200.

Transmissibility $$\left|\frac{x}{F}\right|$$

of a force within a system can be represented as a function of mass, stiffness, and damping according to the following equation (1):

$$\left|\frac{x}{F}\right| = \frac{1}{k\sqrt{\left(1 - \frac{mw^2}{k}\right)^2 + \left(\frac{cw}{k}\right)^2}} \quad (1)$$

where m is the mass of the system, k is the stiffness of the system, c is the viscous damping of the system, F is the magnitude of the external excitation force (e.g., force associated with external vibrations) applied to the system (also referred to as "input force"), w is the frequency of the external force applied to the system, and x is the displacement of the system in the direction of the optical axis (e.g., in the direction of the Y-axis as shown in FIGS. 1A and 1B).

In various embodiments, in addition to the techniques described above to reduce disturbances to the optical components (e.g., caps 206 and 208, Fizeau wedge 302) and/or wafer 106, the measurement cavity 200 has a substantial mass. The mass, m, of the measurement cavity 200 can change the natural frequency of the measurement cavity 200 and increase the amount of energy (force) needed to excite (vibrate) the measurement cavity 200.

Figure 6:
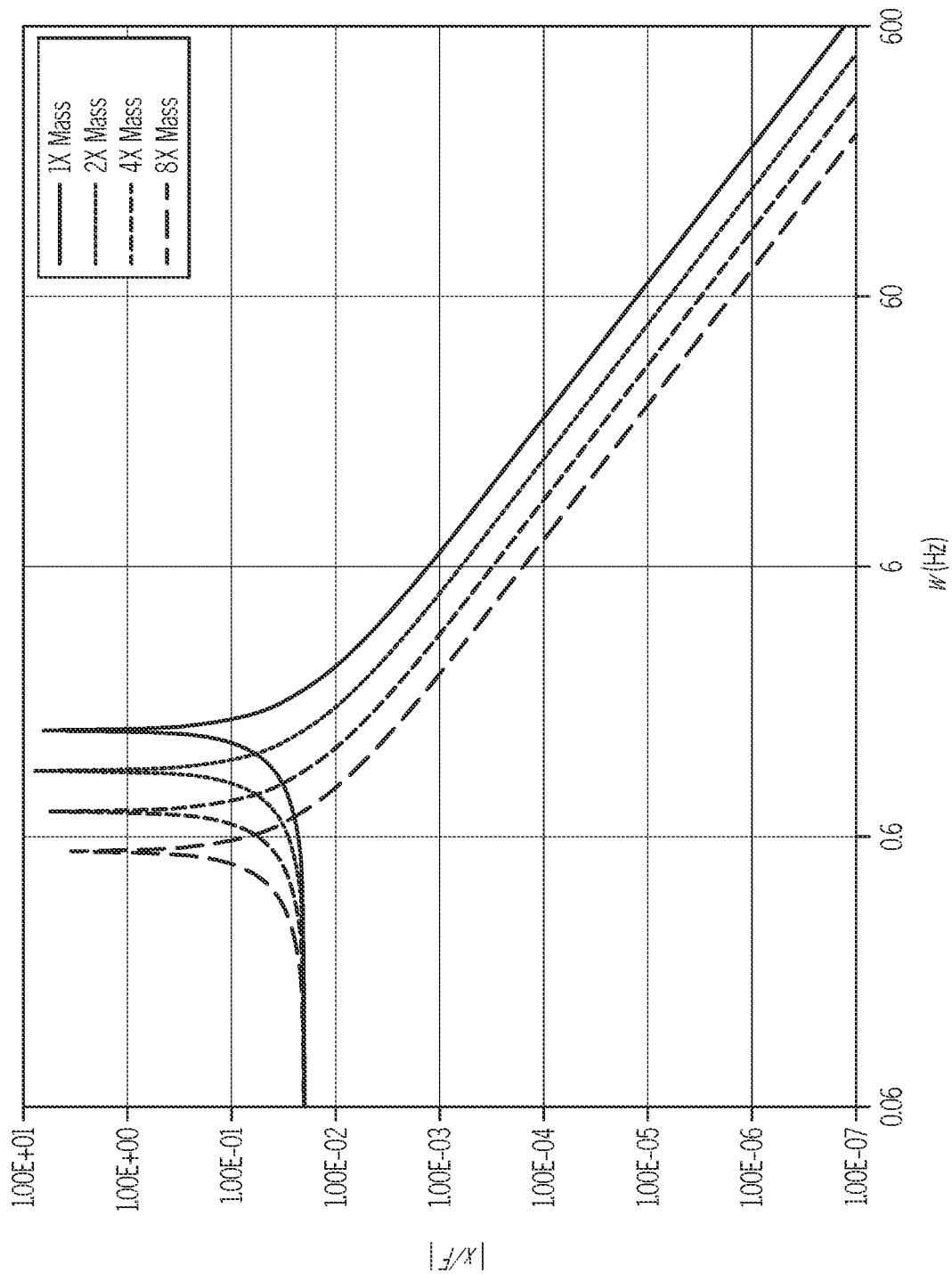
FIG. 6 is a Bode plot illustrating the transmissibility (Y-axis) as a function of frequency (X-axis; in hertz (Hz)) for measurement cavities having different masses according to one or more embodiments shown and described herein.

FIG. 6 is a Bode plot obtained from equation (1) and illustrates the effect of the mass of a measurement cavity on the transmissibility of an input force having magnitude F and displacement x as a function of the frequency w of the input force. Of particular concern is the transmissibility of an input force having a frequency of 60 Hz, which corresponds to the natural frequency of a 300 mm wafer and is also the common electric power frequency in the United States. Accordingly, the electric power in a building can generate a vibrational input force sufficient to induce vibration in the 300 mm wafer in the measurement cavity 200. Suppression of input forces having a frequency of 60 Hz is thus an important design objective for improving the resolution of interferometric measurements of the measurement cavity.

In FIG. 6, the mass of the measurement cavity was varied and the transmissibility was calculated. As shown in FIG. 6, increasing the mass from 1× to 8× decreases the transmissibility of the input force at 60 Hz from about 1.00E-05 ($1.00 \times 10^{-5}$) to about 1.00E-06 ($1.00 \times 10^{-6}$). Additionally, it can be seen that increasing the mass also decreases the natural frequency of the system (corresponding to the frequency of the sharp peak shown in FIG. 6 and representing the frequency of force transmitted most efficiently in the measurement cavity). Thus, in various embodiments, the measurement cavity has a mass effective to decrease the transmissibility of an input force at 60 Hz by at least 10×. In various embodiments, the mass of the measurement cavity is selected such that the measurement cavity has a natural frequency of above 300 Hz and a mass greater than 10× of the wafer holder 202 alone.

Figure 7:
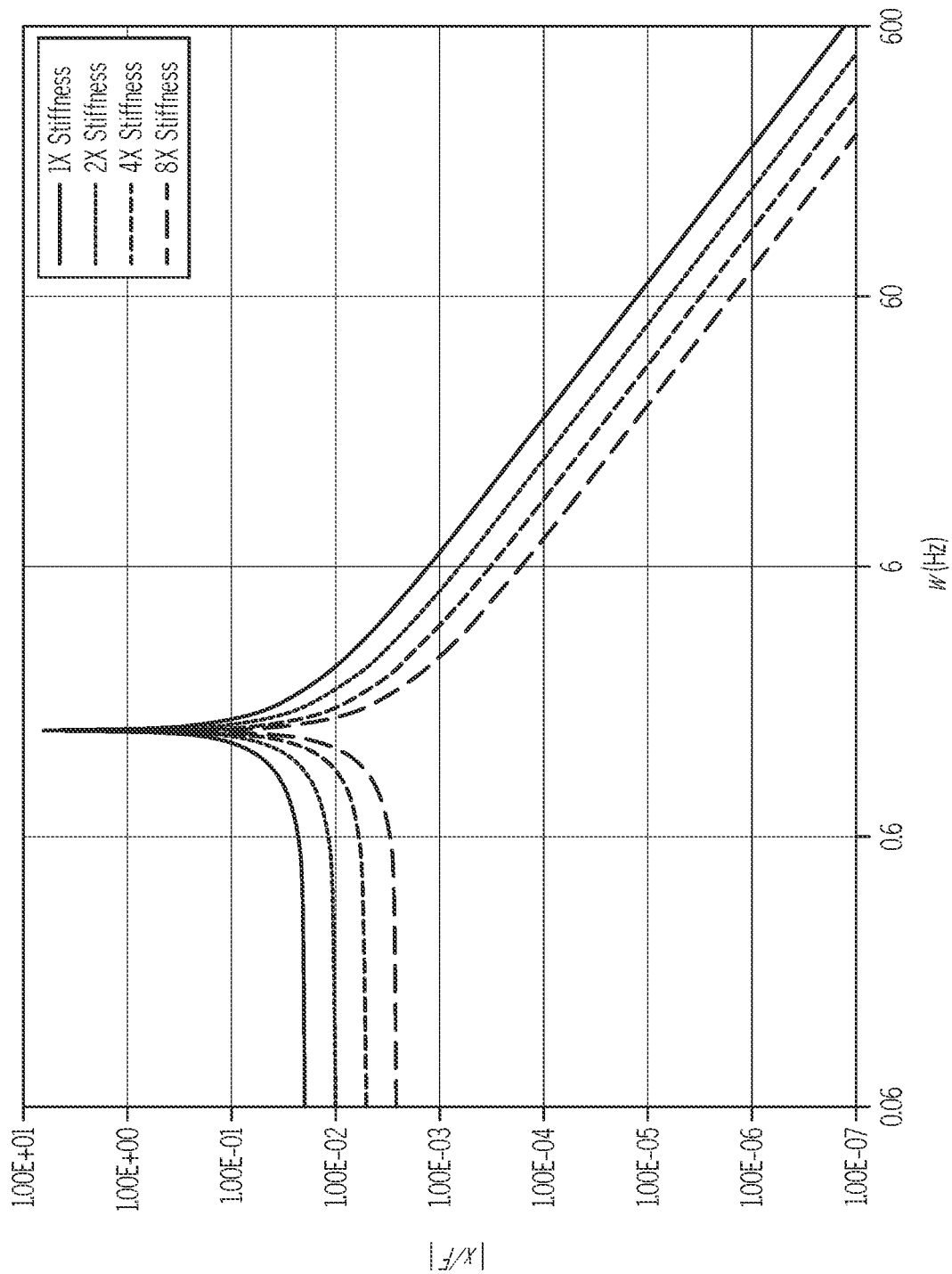
FIG. 7 is a Bode plot illustrating the transmissibility (Y-axis) as a function of frequency (X-axis; in hertz (Hz)) for measurement cavities having different stiffnesses according to one or more embodiments shown and described herein.

As shown in equation (1) above, stiffness of the system also has an effect on the transmissibility of an input force. FIG. 7 is a Bode plot illustrating the effects of the stiffness of the measurement cavity on the transmissibility of an input force having a magnitude F and displacement x as a function of the frequency w of the input force using a calculation based on equation (1). In FIG. 7, the stiffness of the measurement cavity was varied and the transmissibility was calculated. As shown in FIG. 7, increasing the stiffness decreases the transmissibility of an input force having a frequency of 60 Hz, similar to increasing the mass. However, increasing the stiffness did not shift the natural frequency of the system. Thus, in various embodiments, the measurement cavity 200 has a stiffness effective to decrease the transmissibility of an input force at 60 Hz by at least 10×. In various embodiments, the stiffness of the measurement cavity is selected such that the measurement cavity has a natural frequency of above 300 Hz.

Figure 8:
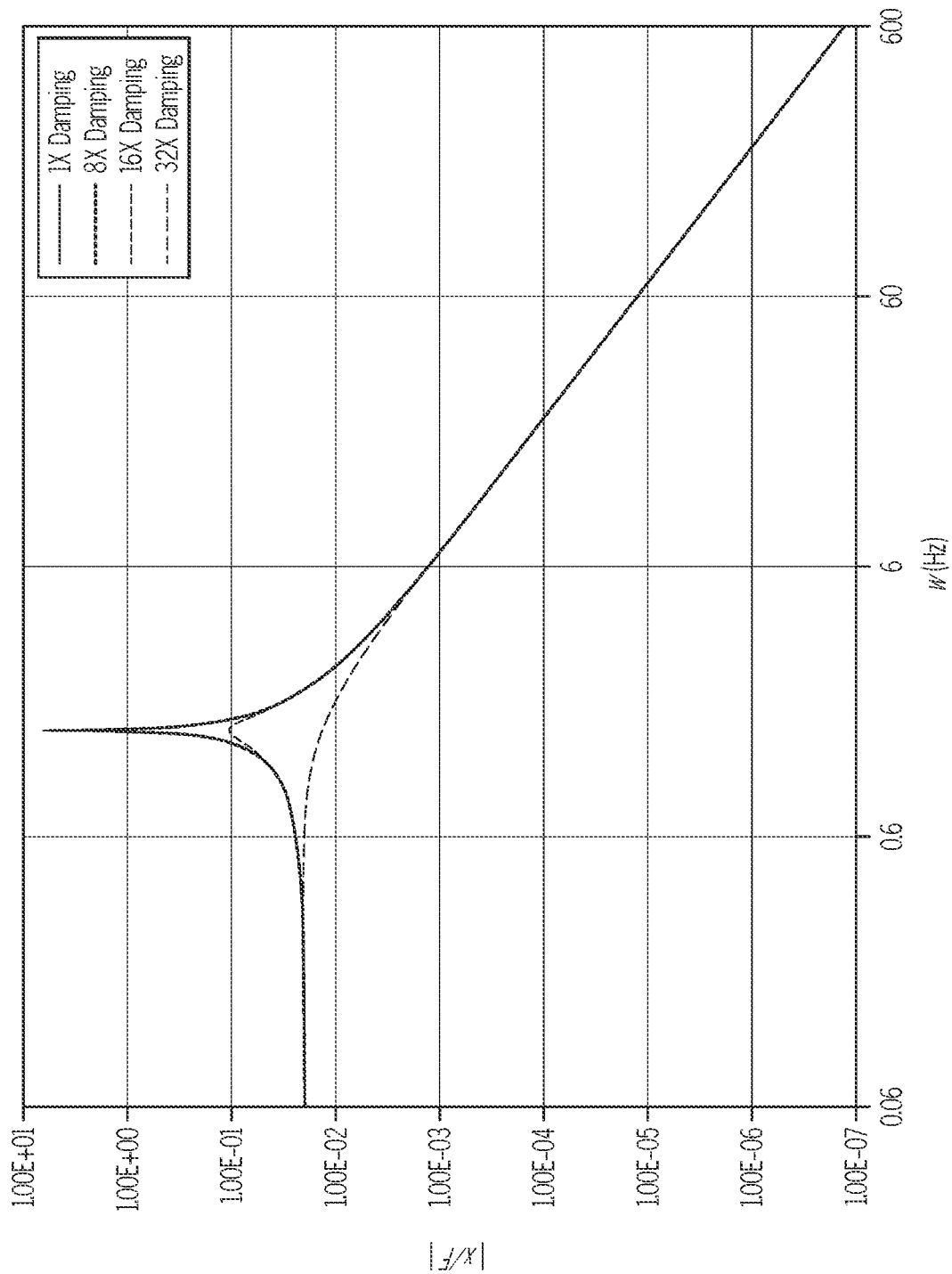
FIG. 8 is a Bode plot illustrating the transmissibility (Y-axis) as a function of frequency (X-axis; in hertz (Hz)) for measurement cavities having different damping according to one or more embodiments shown and described herein.

Damping of the system also has an effect on the transmissibility of an input force. FIG. 8 is a Bode plot illustrating the effects of the damping constant c of the measurement cavity on the transmissibility of an input force having magnitude F and displacement x as a function of the frequency w of the input force using a calculation based on equation (1). In FIG. 8, the damping constant c of the measurement cavity was varied and the transmissibility was calculated. As shown in FIG. 8, increasing the damping constant c had no effect on transmissibility except at the natural frequency, and there was no effect at 60 Hz.

EXAMPLES

Figure 9:
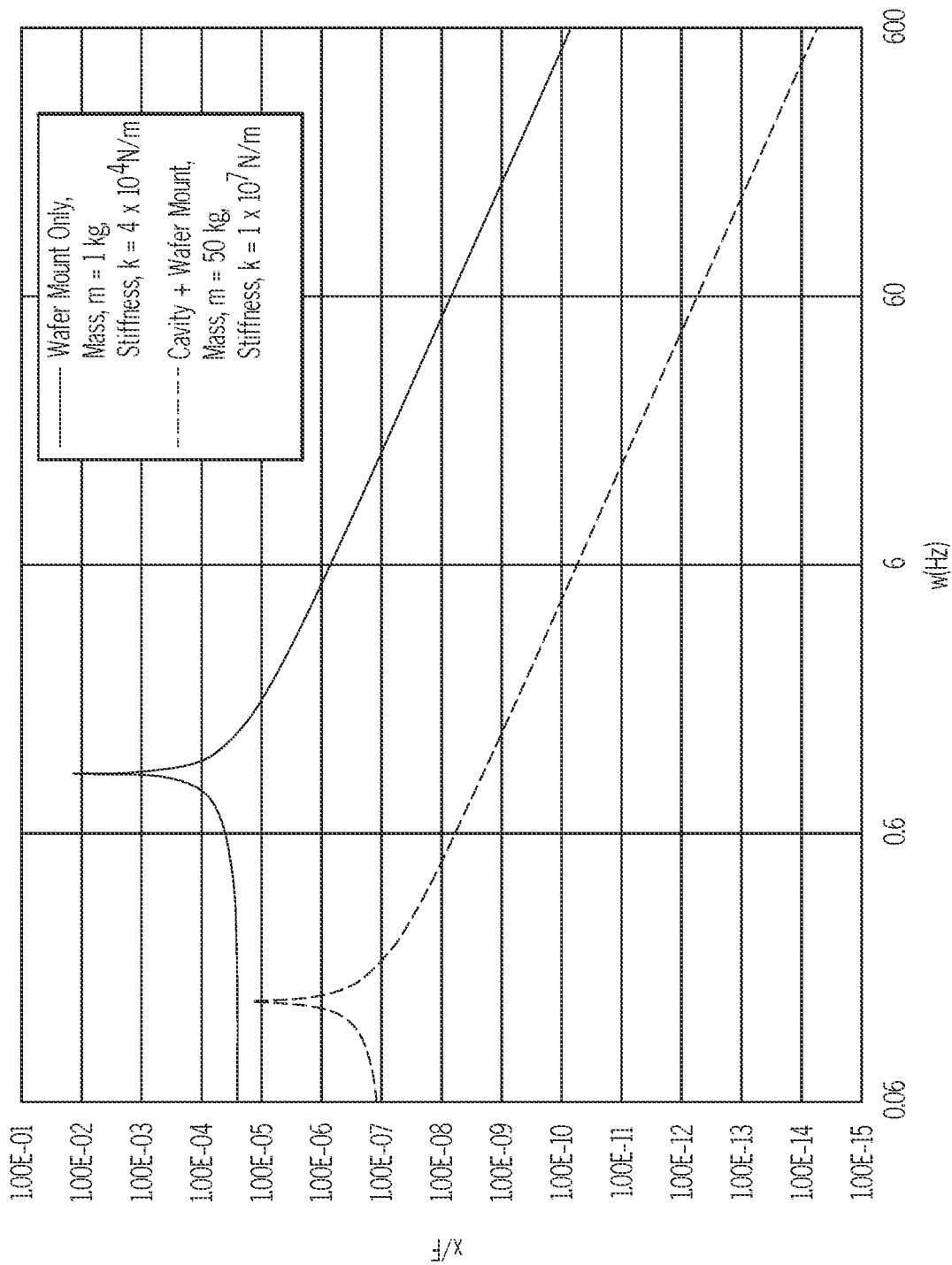
FIG. 9 is a Bode plot illustrating the transmissibility (Y-axis) as a function of frequency (X-axis; in hertz (Hz)) for a wafer mount and for cavity including a wafer mount according to one or more embodiments shown and described herein.

In order to demonstrate the functional performance of the measurement cavity, a representative measurement cavity 200 is compared to its interior wafer holder 202. A measurement cavity 200 is designed such that its mass is 50 kg and first natural frequency is approximately 450 Hz, resulting in a stiffness of $1 \times 10^7$ N/m. Without such a cavity, the wafer holder (mount) 202 on its own has a mass of 1 kg and first resonant frequency of 300 Hz, resulting in a stiffness of $4 \times 10^4$ N/m. Using these numeric examples and equation (1), the resultant Bode plot in FIG. 9 compares the relative transmissibility of the wafer holder 202 and the measurement cavity 200. At the relevant frequency of 60 Hz, the transmissibility is reduced by 4 orders of magnitude (10,000×) by incorporating the wafer holder (mount) 202 within the measurement cavity 200. In addition, the natural frequency of the system has been reduced by a factor of 7×. Note that the damping rate is held constant when comparing cases and for calculation purposes has been set to 0.01.

Accordingly, in various embodiments, the mass, stiffness, and/or damping constant of the measurement cavity 200 is selected to reduce the transmissibility of an input force originating from outside of the measurement cavity 200 through the measurement cavity 200. Examples of such forces include floor vibrations, electrical noise, and acoustic noise. The measurement cavity 200 of various embodiments is also airtight to reduce the effect of airflow on the wafer and to provide acoustic isolation of the wafer 106. These features of the measurement cavity 200 can additionally reduce the effects of temperature and humidity fluctuations on the wafer 106. Accordingly, various embodiments herein provide measurement cavities that can enable optical measurements having improved resolution.

In embodiments, the wafer holder has a first transmissibility $$\left|\frac{x}{F}\right|$$

of an input force F at 60 Hz and the cylindrical chamber has a mass m, a stiffness k, and a damping constant c configured such that the measurement cavity has a second transmissibility $$\left|\frac{x}{F}\right|$$

of the input force at 60 Hz, where the second transmissibility $$\left|\frac{x}{F}\right|$$

is a factor of at least 3 less than, or a factor of at least 5 less than, or a factor of at least 10 less than, or a factor of at least 20 less than the first transmissibility $$\left|\frac{x}{F}\right|$$

when the measurement cavity has a natural frequency of greater than 300 Hz.

It will be apparent to those skilled in the art that various modifications and variations can be made to the embodiments described herein without departing from the spirit and scope of the claimed subject matter. Thus, it is intended that the specification cover the modifications and variations of the various embodiments described herein provided such modification and variations come within the scope of the appended claims and their equivalents.

What is claimed is:

1. A measurement cavity comprising:
a cylindrical chamber having a first open end and a second open end;
a first cap removably provided on the cylindrical chamber to cover the first open end of the cylindrical chamber and a second cap removably provided on the cylindrical chamber to cover the second open end of the cylindrical chamber, wherein the first cap and the second cap hermetically seal an interior of the cylindrical chamber when covering the first open end and the second open end, respectively, and wherein the first cap is rigidly coupled to the second cap; and
a wafer holder positioned within and coupled to the cylindrical chamber, the wafer holder having a first transmissibility |x/F| of an input force F at 60 Hz, wherein x is a displacement of the wafer evaluated in a vertical dimension defined between the first open end and the second open end;
wherein the cylindrical chamber has a mass m, a stiffness k, and a damping constant c configured such that a second transmissibility |x/F| of the input force F at 60 Hz in the measurement cavity is a factor of at least 10 less than the first transmissibility |x/F|, and wherein the measurement cavity has a natural frequency of greater than 300 Hz.

2. The measurement cavity according to claim 1, wherein the first cap, the second cap, or the first cap and the second cap comprise reference optics through which one or more interferometric or optical measurements can be taken.

3. The measurement cavity according to claim 2, wherein the first cap and the second cap comprise reference optics through which one or more interferometric or optical measurements can be taken.

4. The measurement cavity according to claim 2, wherein the reference optics comprise a glass substrate mounted within a bezel.

5. The measurement cavity according to claim 4, wherein the bezel is formed from metal.

6. The measurement cavity according to claim 4, wherein the bezel is rigidly coupled to the cylindrical chamber.

7. The measurement cavity according to claim 6, wherein the bezel is bolted to the cylindrical chamber.

8. The measurement cavity according to claim 4, wherein epoxy seals the glass substrate within the bezel.

9. The measurement cavity according to claim 1, wherein the wafer holder is rigidly coupled to the cylindrical chamber.

10. The measurement cavity according to claim 1, wherein the wafer holder is coupled to the cylindrical chamber via one or more springs.

11. The measurement cavity according to claim 1, wherein the wafer holder is configured to hold a wafer without contacting first and second side surfaces of the wafer.

12. The measurement cavity according to claim 1, wherein the first cap is rigidly coupled to the second cap via a clamp.

13. The measurement cavity according to claim 1, wherein the first cap is rigidly coupled to the second cap via one or more bolts.

14. The measurement cavity according to claim 1, wherein the cylindrical chamber sets a gap between a first face of the first cap and a first face of the second cap.

15. The measurement cavity according to claim 1, wherein the cylindrical chamber is formed from a metal or metal-based substrate.

16. The measurement cavity according to claim 15, wherein the cylindrical chamber is formed from an aluminum-based substrate or stainless steel.

17. The measurement cavity according to claim 1, wherein the first cap and the second cap are mounted in a non-deforming configuration with respect to one another.

18. An interferometer comprising the measurement cavity according to claim 1.

19. The interferometer according to claim 18, wherein the interferometer makes measurements from one of the first and second caps.

20. The interferometer according to claim 18, wherein the interferometer is a compound interferometer and makes measurements from the first and second caps.

21. The measurement cavity according to claim 1, wherein the wafer holder is coupled to an interior bore surface of the cylindrical chamber.

22. The measurement cavity according to claim 1, wherein the wafer holder has a second mass $m_2$, and the mass of the cylindrical chamber m is greater than 10 times the second mass $m_2$ of the wafer holder.

* * * * *